United States Patent
Tamegaya

(10) Patent No.: US 8,362,785 B2
(45) Date of Patent: Jan. 29, 2013

(54) SEMICONDUCTOR DEVICE AND SEMICONDUCTOR DEVICE MEASURING SYSTEM

(75) Inventor: Yukio Tamegaya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 468 days.

(21) Appl. No.: 12/765,609

(22) Filed: Apr. 22, 2010

(65) Prior Publication Data

US 2010/0271065 A1 Oct. 28, 2010

(30) Foreign Application Priority Data

Apr. 23, 2009 (JP) .................... 2009-105588

(51) Int. Cl.
*G01R 31/12* (2006.01)
*G01R 31/02* (2006.01)
*G01R 31/26* (2006.01)
*H01L 23/58* (2006.01)

(52) U.S. Cl. .............. 324/548; 324/762.01; 438/17; 257/48

(58) Field of Classification Search ............ 324/548, 324/762.01, 762.07–762.1; 438/14–18; 257/48
See application file for complete search history.

(56) References Cited

U.S. PATENT DOCUMENTS

| 5,561,387 | A | * | 10/1996 | Lee | 324/762.09 |
| 6,275,059 | B1 | * | 8/2001 | Sah et al. | 324/762.05 |
| 6,295,630 | B1 | * | 9/2001 | Tamegaya | 716/136 |
| 6,812,730 | B2 | * | 11/2004 | Pan | 324/762.09 |
| 6,906,548 | B1 | * | 6/2005 | Toshiyuki et al. | 324/762.02 |
| 7,176,706 | B2 | * | 2/2007 | Toshiyuki et al. | 438/17 |
| 7,327,155 | B2 | * | 2/2008 | Hillard | 324/754.26 |
| 8,183,879 | B2 | * | 5/2012 | Brederlow et al. | 324/762.09 |

FOREIGN PATENT DOCUMENTS

JP 09-074122 A 3/1997

* cited by examiner

*Primary Examiner* — Joshua Benitez Rosario
(74) *Attorney, Agent, or Firm* — Sughrue Mion, PLLC

(57) ABSTRACT

A semiconductor device includes: a well of a second conductive type formed on or above a semiconductor substrate of a first conductive type; a first diffusion layer of the second conductive type formed in a surface portion of the well; a second diffusion layer of the first conductive type formed separately from the first diffusion layer in the surface portion of the well; first to third first-layer conductive layers formed above the well; and first to third second-layer conductive layers formed above the first to third first-layer conductive layers. The first second-layer conductive layer, the first first-layer conductive layer, the first diffusion layer and the well are conductively connected as a first conductive path. The second second-layer conductive layer, the second first-layer conductive layer, and the second diffusion layer are conductively connected as a second conductive path. The third second-layer conductive layer, and the third first-layer conductive layer are conductively connected as a third conductive path.

18 Claims, 15 Drawing Sheets

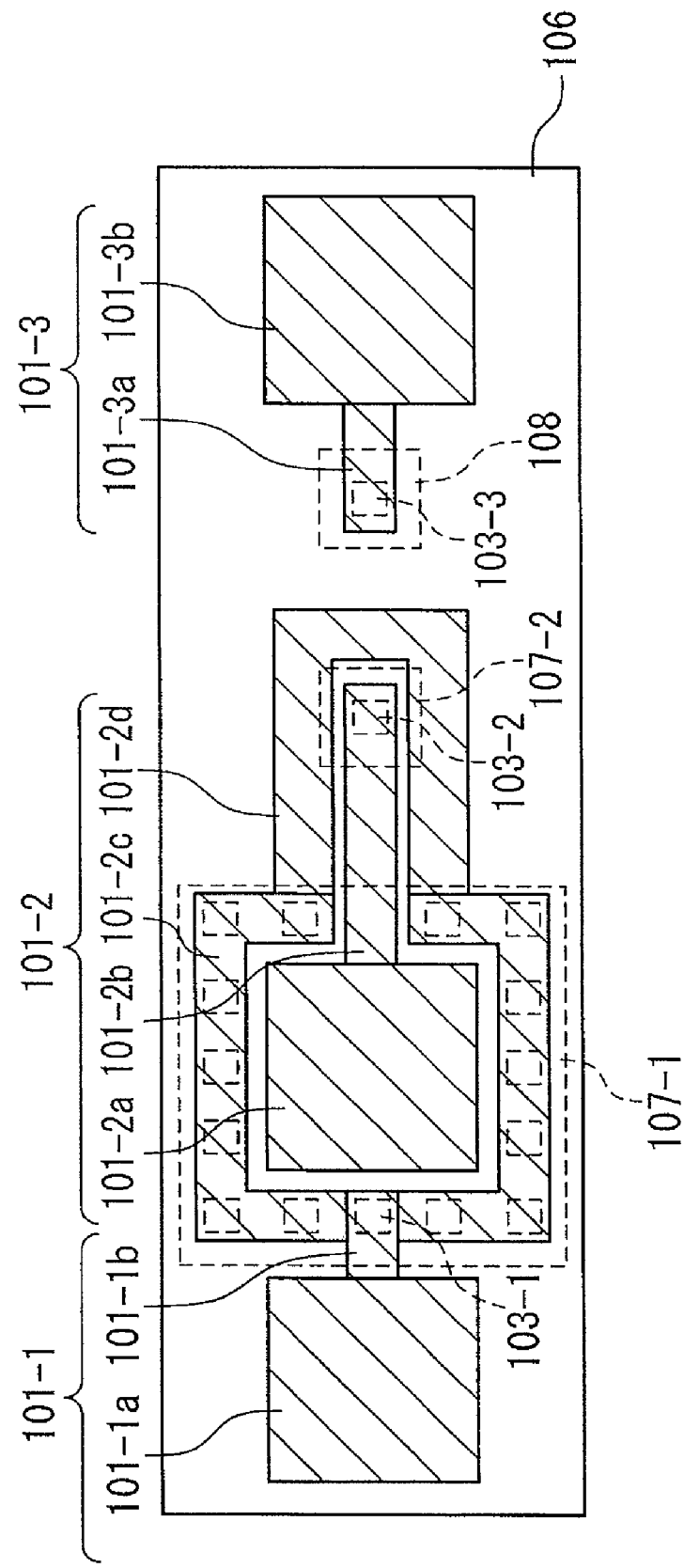

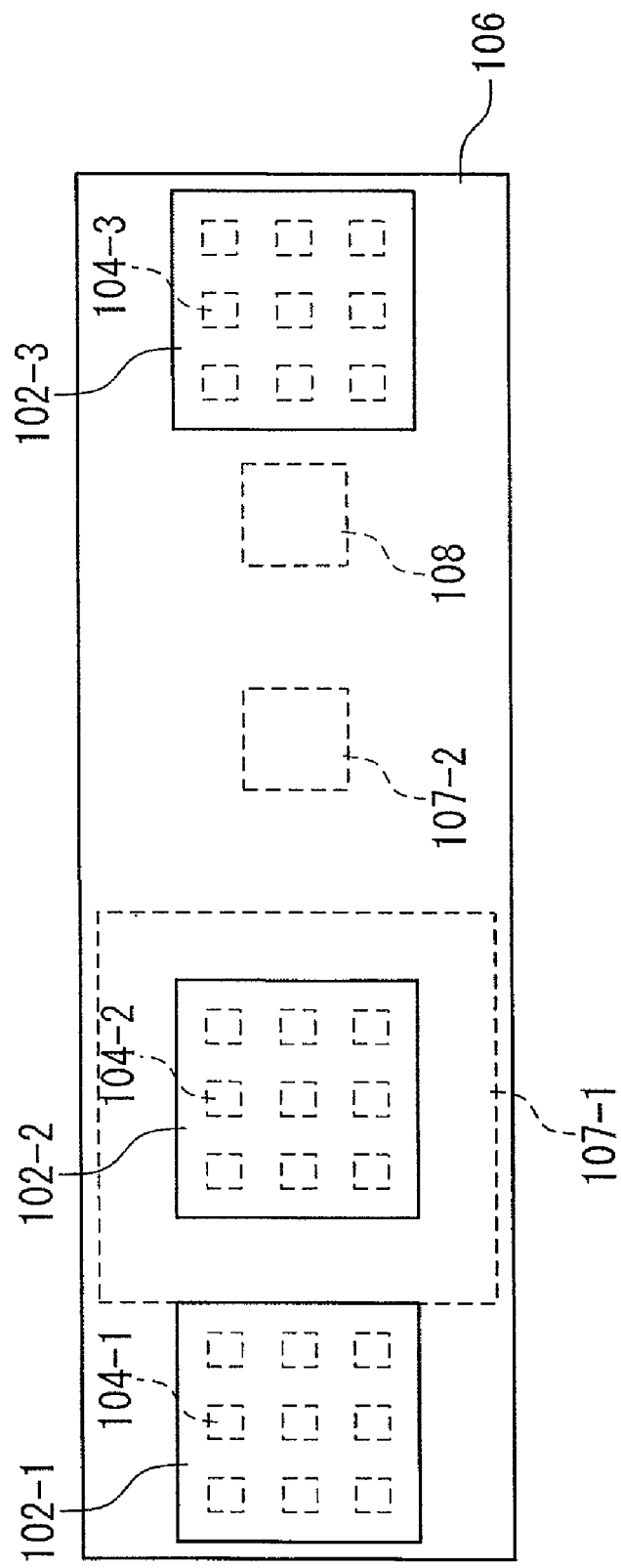

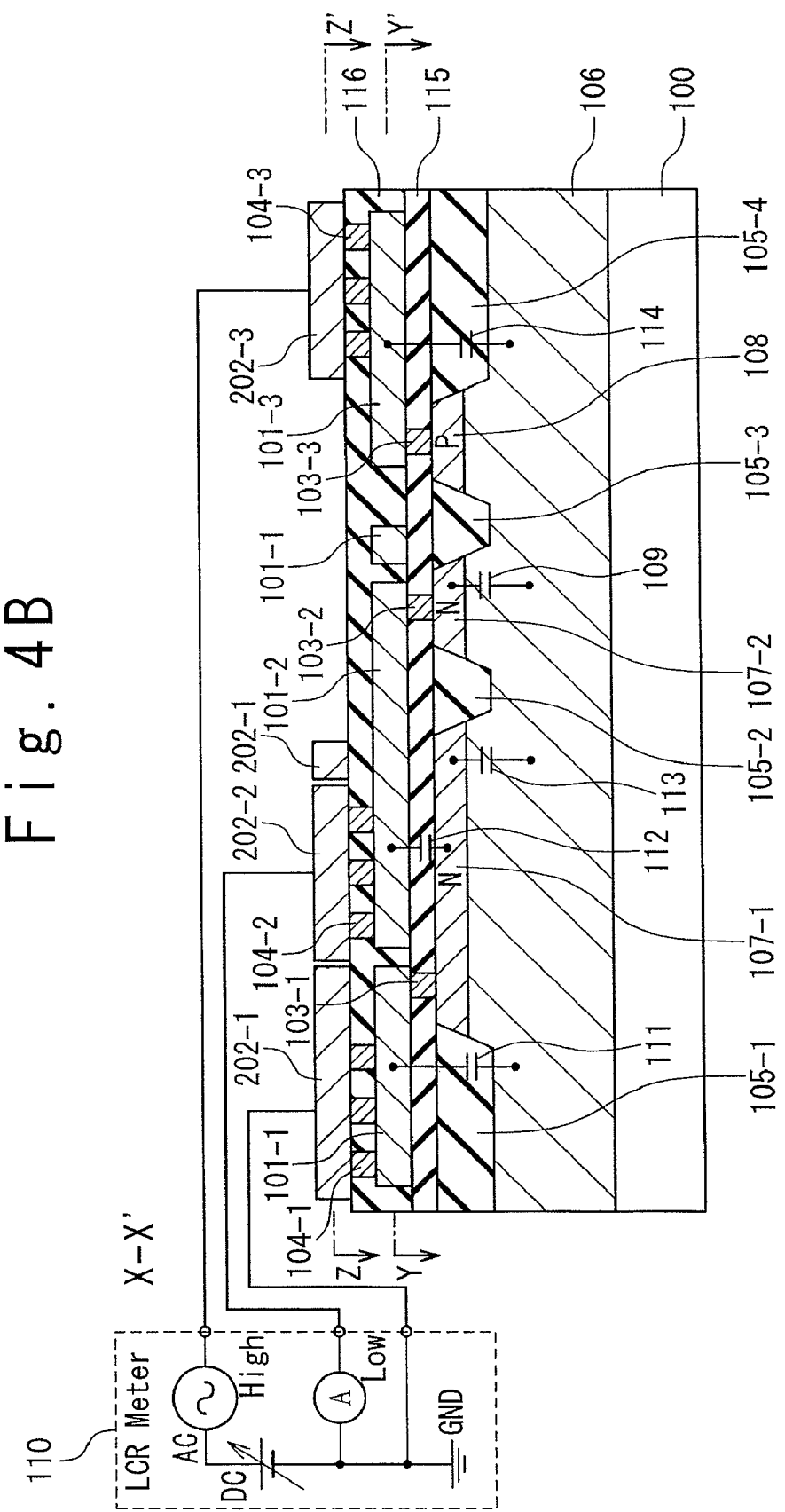

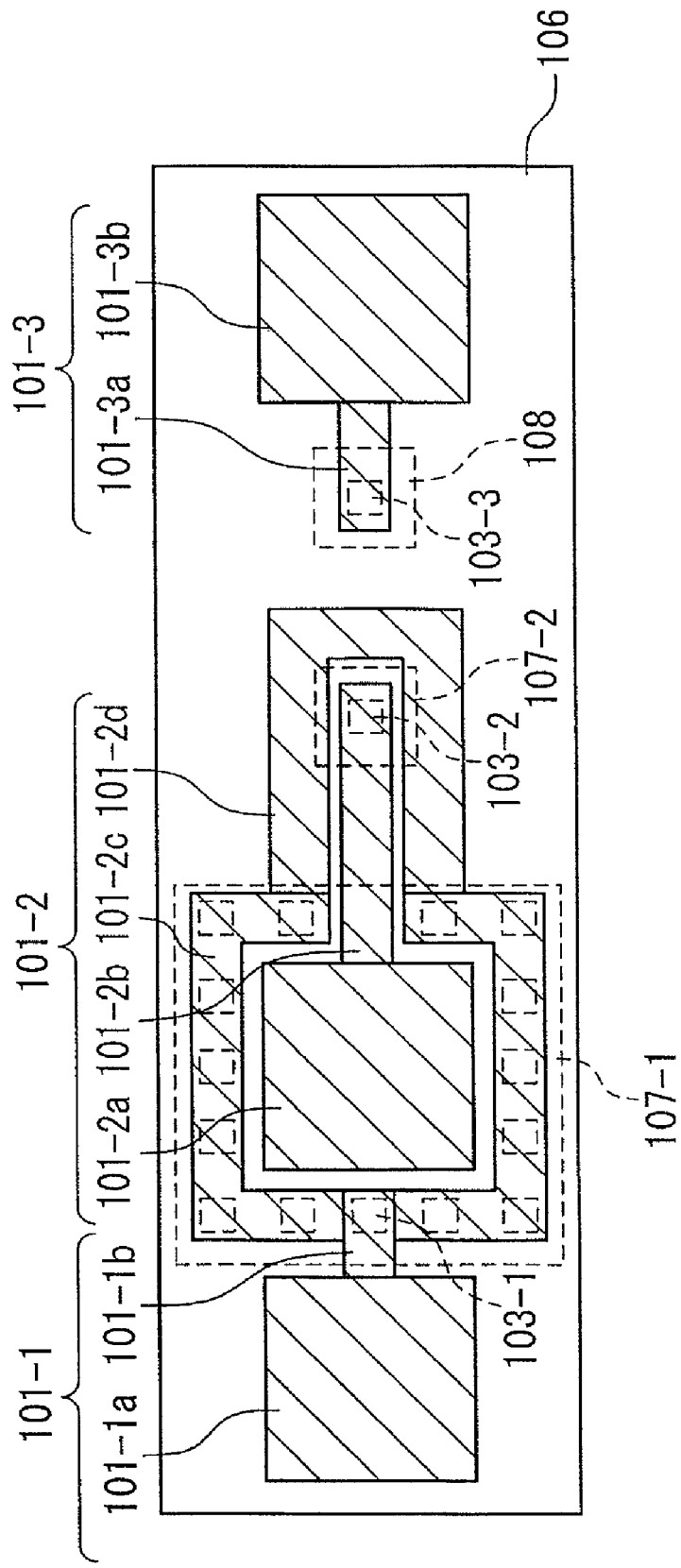

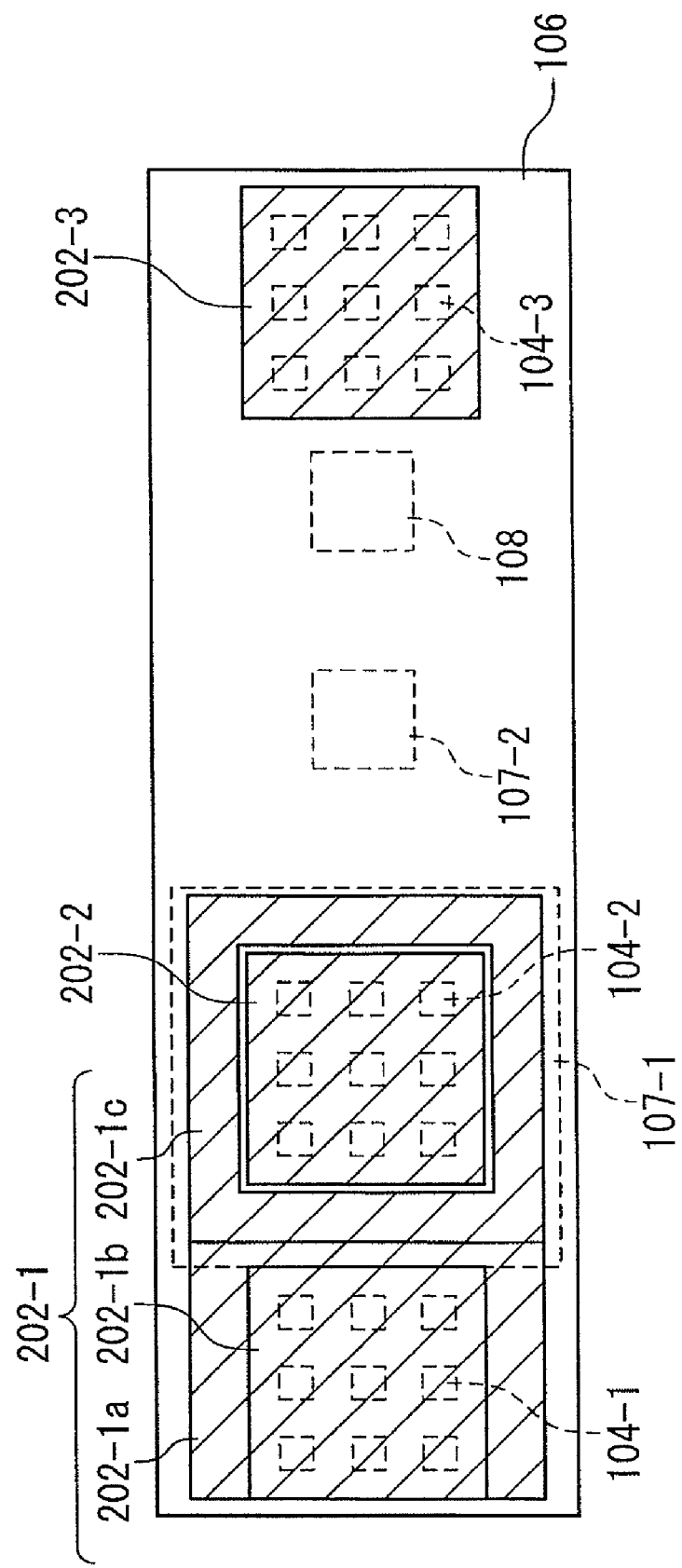

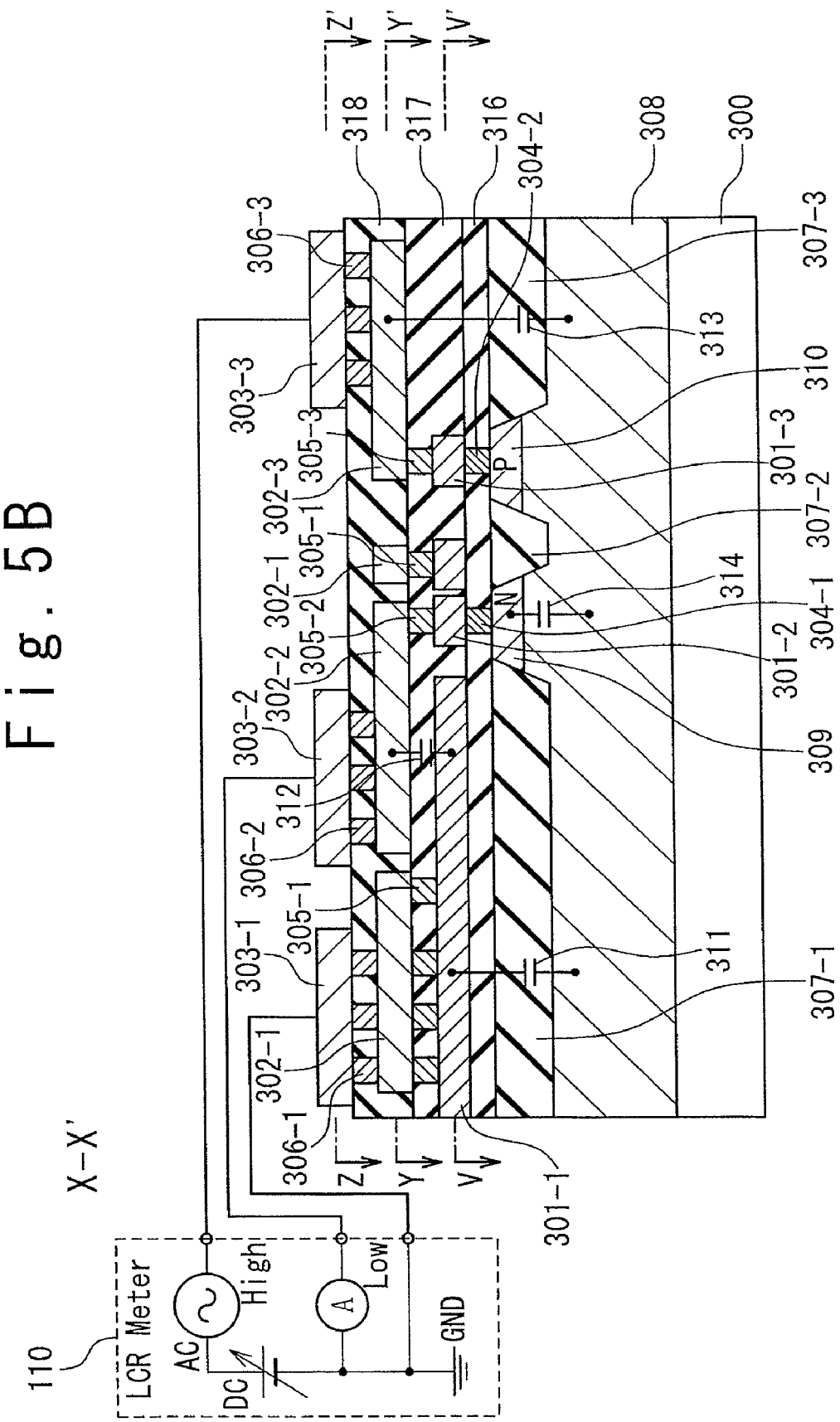

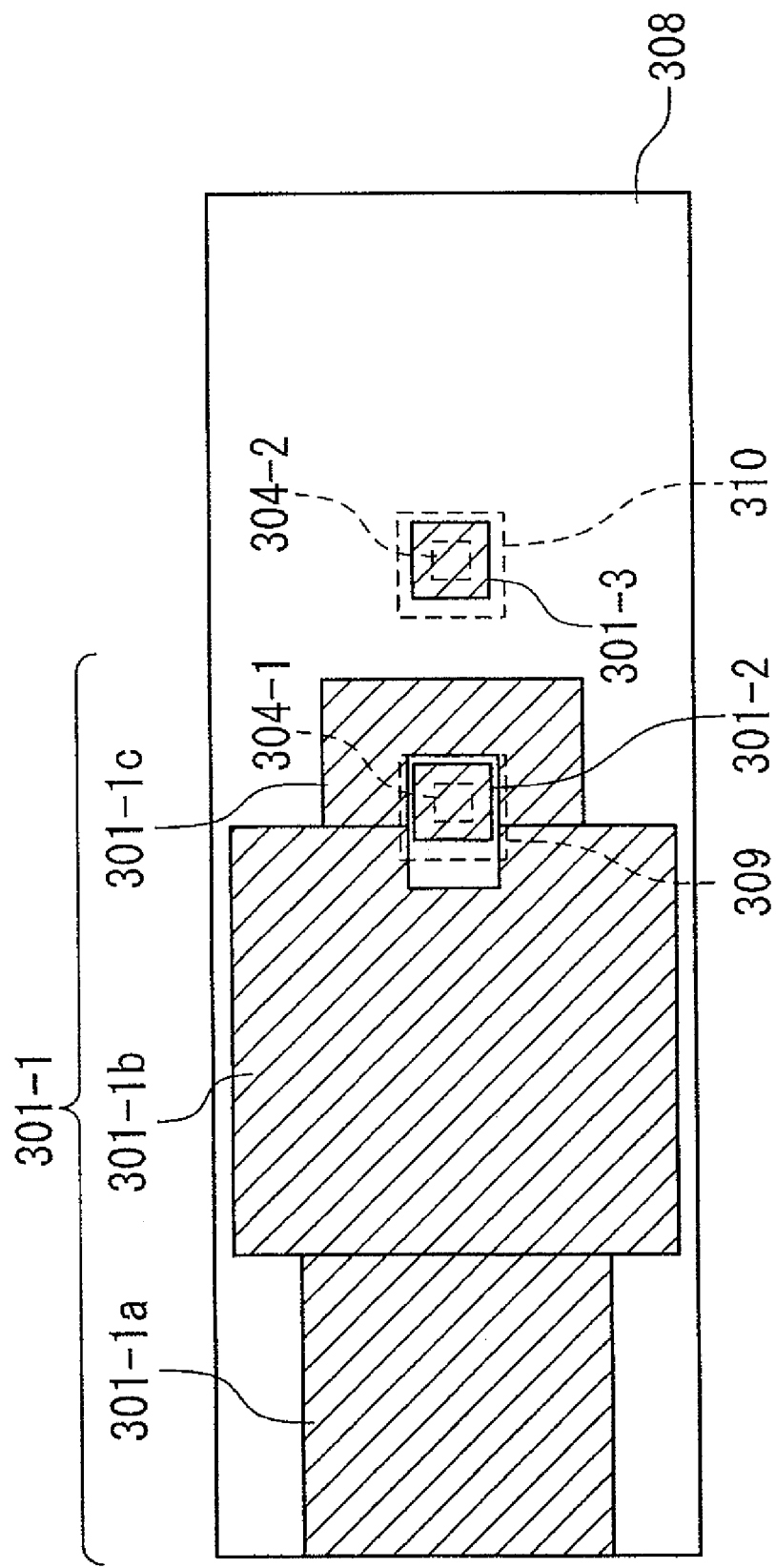

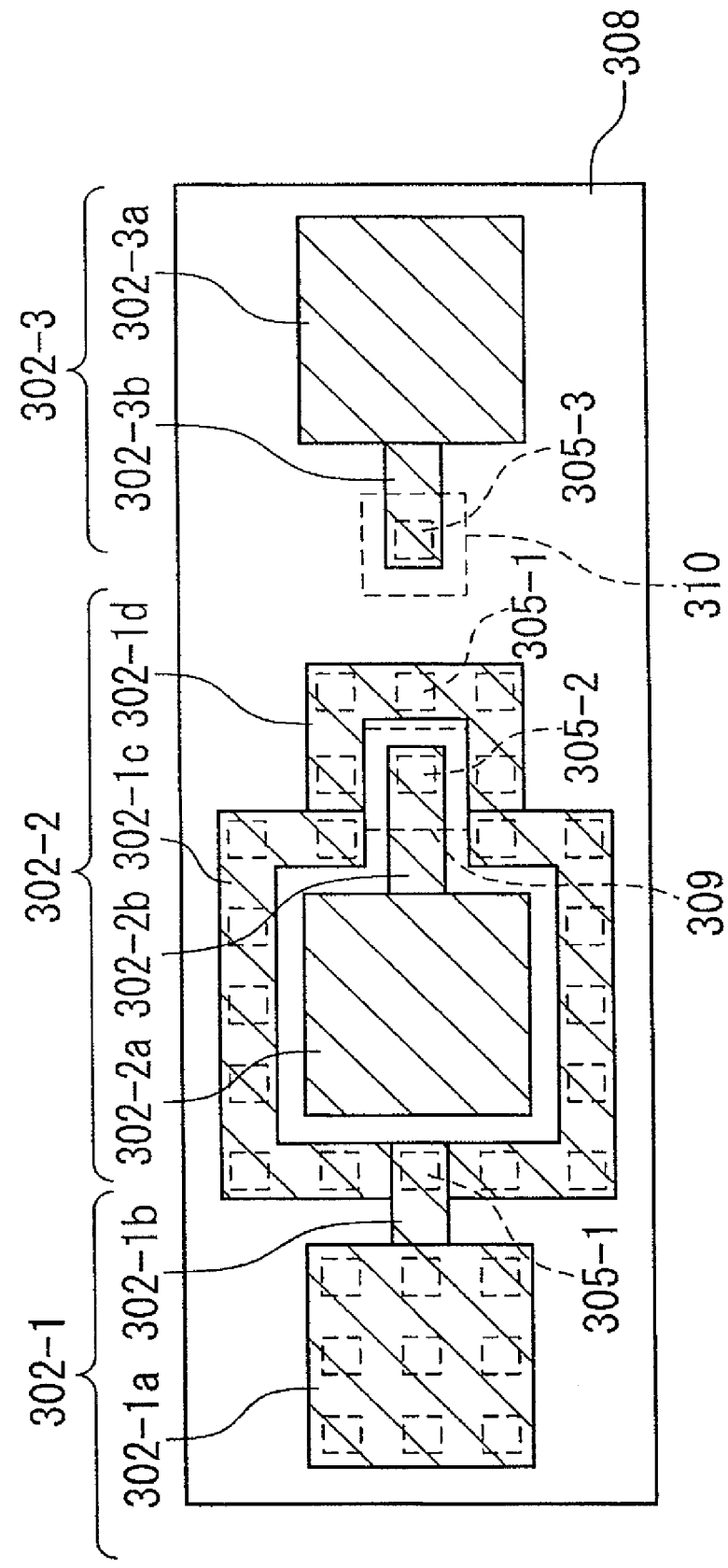

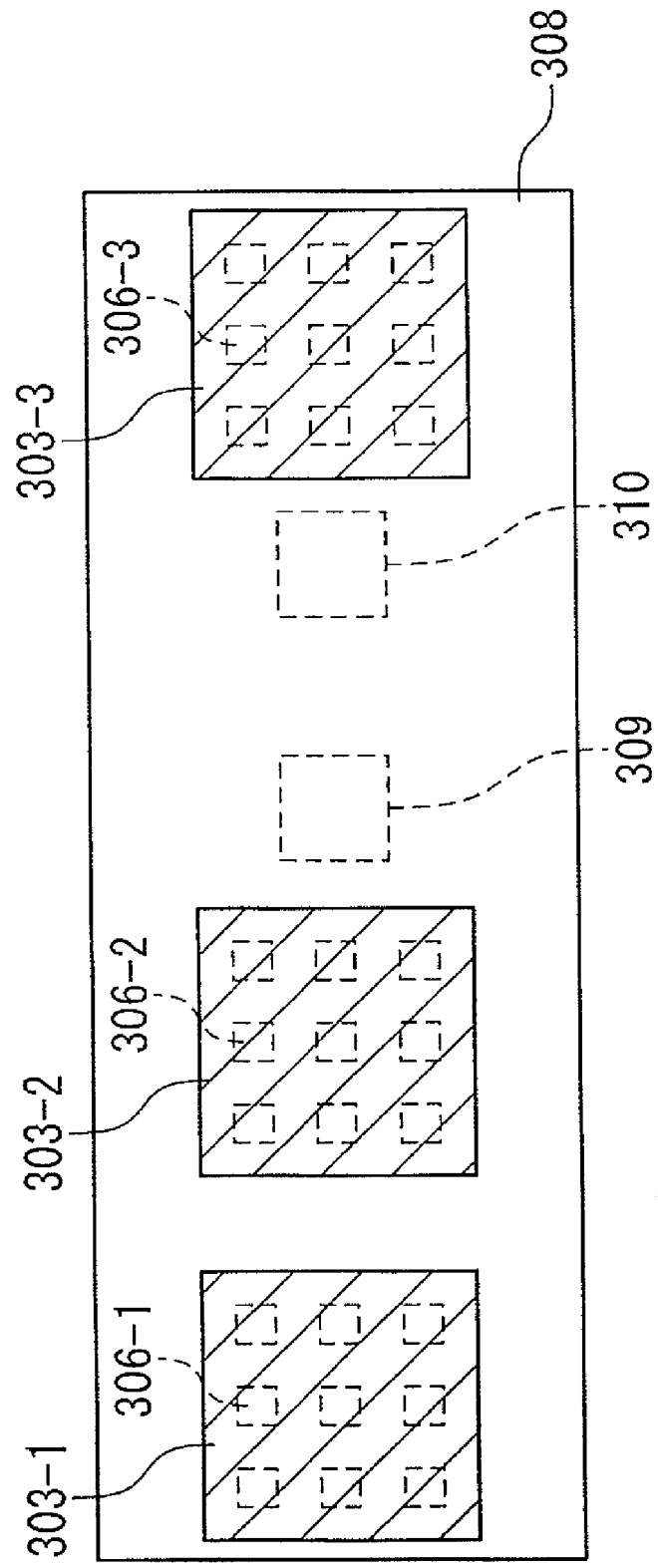

SEMICONDUCTOR DEVICE AND SEMICONDUCTOR DEVICE MEASURING SYSTEM

INCORPORATION BY REFERENCE

This patent application claims a priority on convention based on Japanese Patent Application No. 2009-105588. The disclosure thereof is incorporated herein by reference.

TECHNICAL FIELD

The present invention relates to a semiconductor device and, in particular, to a semiconductor device measuring system for evaluating the semiconductor device.

BACKGROUND ART

In a process of developing and manufacturing a semiconductor device, the semiconductor device is evaluated by measuring a PN junction capacitance between a well of a first conductive type and a diffusion layer of a second conductive type in the semiconductor device. Here, a case where a conventional technique described in Japanese Patent Publication (JP-A-Heisei 9-74122: patent literature 1) is applied to measurement of a capacitance of a semiconductor device will be described. In this case, two kinds of measurement patterns of a DUT (Device Under Test) pattern semiconductor device and a calibration pattern semiconductor device are used.

FIG. 1A shows a plan view of the DUT pattern semiconductor device, and FIG. 1B is a diagram showing a sectional of the semiconductor device along on a line X-X' of FIG. 1A and a semiconductor device measuring system applied to the DUT pattern semiconductor device.

The DUT pattern semiconductor device includes a semiconductor substrate 400 of a first conductive type; a well 406 of a second conductive type; insulating films 405-1 to 405-3; a diffusion layer 407 of the first conductive type; a diffusion layer 408 of the second conductive type; an insulating film 413; via-contacts 403-1, 403-2; first-layer metal wiring layers 401-1 and 401-2; an insulating film 414; via-contacts 404-1 and 404-2; and second-layer metal wiring layers 402-1 and 402-2. Here, the first conductive type and the second conductive type are assumed to be an N-type and a P-type, respectively.

The semiconductor substrate 400 of the N-type has the well 406 of the P-type formed on the surface portion thereof. The well 406 of the P-type has the insulating films 405-1 to 405-3 formed in its surface portion thereof. The diffusion layer 407 of the N-type is formed between the insulating film 405-1 and the insulating film 405-2 in the surface portion of the well 406 of the P-type. The diffusion layer 408 of the P-type is formed between the insulating film 405-2 and the insulating film 405-3 in the surface portion of well 406 of the P-type. The well 406 of the P-type, the insulating films 405-1 to 405-3, the diffusion layer 407 of the N-type, and the diffusion layer 408 of the P-type are covered with the insulating film 413. The via-contact 403-1 is formed on the diffusion layer 407 of the N-type to pass through the insulating film 413. The via-contact 403-2 is formed on the diffusion layer 408 of the P-type to pass through the insulating film 413. The first-layer metal wiring layers 401-1 and 401-2 are formed on the via-contacts 403-1 and 403-2, respectively.

The first-layer meal wiring layers 401-1 and 401-2 are covered with the insulating film 414. The via-contacts 404-1 are formed on the first-layer meal wiring layer 401-1 to pass through the insulating film 414. The via-contacts 404-2 are formed on the first-layer meal wiring layer 401-2 to pass through the insulating film 414. The second-layer metal wiring layers 402-1 and 402-2 are formed on the via-contacts 404-1 and 404-2, respectively.

An LCR meter is usually used for measurement of the DUT pattern semiconductor device. The LCR meter 410 has a power supply and an ammeter. The power supply is connected between a ground terminal GND grounded and a high-voltage terminal High for supplying a first voltage. The ammeter is connected between a low-voltage terminal Low for supplying a second voltage lower than the first voltage, and the ground terminal GND. In the LCR meter 410, a voltage, in which a small AC voltage is superimposed on a DC bias voltage, is applied between the high voltage terminal High and the low voltage terminal Low from the power supply to a target member, and an AC current (absolute value and phase) is measured by the ammeter. Thus, the capacitance of the target member (the PN junction capacitance in this example) is calculated.

The low voltage terminal Low and the high voltage terminal High of the LCR meter 410 are respectively connected to the second-layer metal wiring layers 402-1 and 402-2 so as to measure the PN junction capacitance 409 between the diffusion layer 407 of the N-type and the well 406 of the P-type by this LCR meter 410.

There are two parasitic capacitances to be removed from the measurement in the DUT pattern semiconductor device: a parasitic capacitance 411 formed between the first-layer metal wiring layer 401-1 and the well 406 of the P-type; and a parasitic capacitance 412 formed between the first-layer metal wiring layer 401-2 and the well 406 of the P-type.

Next, an operation of a conventional semiconductor device measuring system will be described. The voltage in which a small AC voltage is superimposed on a DC bias voltage is applied to the second-layer metal wiring layer 402-2 from the high voltage terminal High of the LCR meter 410. At this time, a charging/discharging current due to the PN junction capacitance 409 flows from the high voltage terminal High to the second-layer metal wiring layer 402-2, the via-contacts 404-2, the first-layer metal wiring layer 401-2, the via-contact 403-2, the diffusion layer 408 of the P-type, the well 406 of the P-type, the PN junction capacitance 409, the diffusion layer 407 of the N-type, the via-contact 403-1, the first-layer metal wiring layer 401-1, the via-contacts 404-1, the second-layer metal wiring layer 402-1, and the low voltage terminal Low.

At the same time, a charging/discharging current due to the parasitic capacitance 411 flows from the high voltage terminal High to the second-layer metal wiring layer 402-2, the via-contacts 404-2, the first-layer metal wiring layer 401-2, the via-contact 403-2, the diffusion layer 408 of the P-type, the well 406 of the P-type, the parasitic capacitance 411, the first-layer metal wiring layer 401-1, the via-contacts 404-1, the second-layer metal wiring layer 402-1, and the low voltage terminal Low. Both ends of the parasitic capacitance 412 are electrically short-circuited by the first-layer metal wiring layer 401-2, the via-contact 403-2, the diffusion layer 408 of the P-type, and the well 406 of the P-type. Thus, the charging/discharging current by the parasitic capacitance 412 does not flow.

Here, the charging/discharging current due to the parasitic capacitance 411 flows to the low voltage terminal Low of the LCR meter 410, so that the value of the parasitic capacitance 411 is included in the measured value of the LCR meter 410. In this case, a total value of the PN junction capacitance 409 and the parasitic capacitance 411 is measured as the measured value of the LCR meter 410.

FIG. 2A shows a plan view of the calibration pattern semiconductor device. FIG. 2B is a diagram showing the section of the semiconductor device along a line X-X' of FIG. 2A and the semiconductor device measuring system applied to the calibration pattern semiconductor device. In the calibration pattern semiconductor device, the via-contact 403-1 is removed from the DUT pattern semiconductor device.

In the calibration pattern semiconductor device, because there is not the via-contact 403-1, the charging/discharging current due to the PN junction capacitance 409 does not flow but only the charging/discharging current due to the parasitic capacitance 411 flows through the LCR 410. In this case, the parasitic capacitance 411 is measured as the measured value of the LCR meter 410.

In this manner, in the conventional semiconductor device measuring system, the value of only the PN junction capacitance 409 can be obtained by subtracting the measured value of the calibration pattern semiconductor device from the measured value of the DUT pattern semiconductor device.

CITATION LIST

[Patent literature 1] JP-A-Heisei 9-74122

SUMMARY OF THE INVENTION

In a conventional semiconductor device measuring system, two kinds of measurement patterns of a DUT pattern semiconductor device and a calibration pattern semiconductor device are required to correctly measure a semiconductor capacitance (here, PN junction capacitance), that is, to measure a semiconductor capacitance excluding a parasitic capacitance.

As described above, in the conventional semiconductor device measuring system, the DUT pattern semiconductor device and the calibration pattern semiconductor device need a nearly equal area. Thus, the area of the measurement pattern increases in the calibration pattern semiconductor device.

Further, in the conventional semiconductor device measuring system, two kinds of measurement patterns of the DUT pattern semiconductor device and the calibration pattern semiconductor device need to be prepared. AS a result, the number of man-hours required for designing increases.

Still further, in the conventional semiconductor device measuring system, the semiconductor capacitance needs to be measured in the DUT pattern semiconductor device and the calibration pattern semiconductor device. As a result, the number of man-hours required for measurement increases.

In an aspect of the present invention, a semiconductor device includes: a well of a second conductive type formed on or above a semiconductor substrate of a first conductive type; a first diffusion layer of the second conductive type formed in a surface portion of the well; a second diffusion layer of the first conductive type formed separately from the first diffusion layer in the surface portion of the well; first to third first-layer conductive layers formed above the well; and first to third second-layer conductive layers formed above the first to third first-layer conductive layers. The first second-layer conductive layer, the first first-layer conductive layer, the first diffusion layer and the well are conductively connected as a first conductive path. The second second-layer conductive layer, the second first-layer conductive layer, and the second diffusion layer are conductively connected as a second conductive path. The third second-layer conductive layer, and the third first-layer conductive layer are conductively connected as a third conductive path. In measurement of a capacitance between the well and the second diffusion layer, the first second-layer conductive layer is configured to be applied with a voltage, in which a small-amplitude AC voltage is superimposed on a DC bias voltage, from a measuring apparatus, the second second-layer conductive layer is configured to be connected to a ground terminal of the measuring apparatus through an ammeter, and the third second-layer conductive layer is configured to be connected to the ground terminal.

In another aspect of the present invention, a measuring method of a semiconductor device, is achieved by providing a semiconductor device which comprises:

a well of a second conductive type formed on or above a semiconductor substrate of a first conductive type, a first diffusion layer of the second conductive type formed in a surface portion of the well, a second diffusion layer of the first conductive type formed separately from the first diffusion layer in the surface portion of the well, first to third first-layer conductive layers formed above the well, and first to third second-layer conductive layers formed above the first to third first-layer conductive layers, wherein the first second-layer conductive layer, the first first-layer conductive layer, the first diffusion layer and the well are conductively connected as a first conductive path; wherein the second second-layer conductive layer, the second first-layer conductive layer, and the second diffusion layer are conductively connected as a second conductive path; wherein the third second-layer conductive layer, and the third first-layer conductive layer are conductively connected as a third conductive path. The measuring method is achieved by further applying the first second-layer conductive layer with a voltage, in which a small-amplitude AC voltage is superimposed on a DC bias voltage, from a power supply of a measuring apparatus; by further connecting the third second-layer conductive layer to the ground terminal; by further connecting the second second-layer conductive layer to a ground terminal of the measuring apparatus through the ammeter; and by further measuring a current flowing through the second second-layer conductive layer by an ammeter of the measuring apparatus.

As described above, according to the semiconductor device of the present invention, it is possible to measure the semiconductor capacitance excluding the parasitic capacitances, in other words, to correctly measure the semiconductor capacitance. Further, according to the semiconductor device of the present invention, it is possible to reduce the space of the measurement pattern and to shorten the measurement time as compared with the conventional semiconductor device measuring system.

BRIEF DESCRIPTION OF THE DRAWINGS

The above and other objects, advantages and features of the present invention will be more apparent from the following description of certain embodiments taken in conjunction with the accompanying drawings, in which:

FIGS. 3C and 3D are plan views along line Y-Y' and a line Z-Z' of FIG. 3B, respectively;

FIG. 4B is a diagram showing a section of the semiconductor device in the second embodiment along a line X-X' of FIG. 4A and a semiconductor device measuring system;

FIGS. 4C and 4D are plan view along a line Y-Y' and a line Z-Z' of FIG. 4B;

FIG. 5B is a diagram showing a section of the semiconductor device in the third embodiment along a line X-X' of FIG. 5A and the semiconductor device measuring system; and FIGS. 5C, 5D and 5E are plan views of the semiconductor device along a line V-V', a line Y-Y' and a line Z-Z' in FIG. 5B, respectively.

DESCRIPTION OF EMBODIMENTS

Hereinafter, a semiconductor device according to the present invention will be described in detail with reference to the attached drawings.

First Embodiment

Figure 1A:
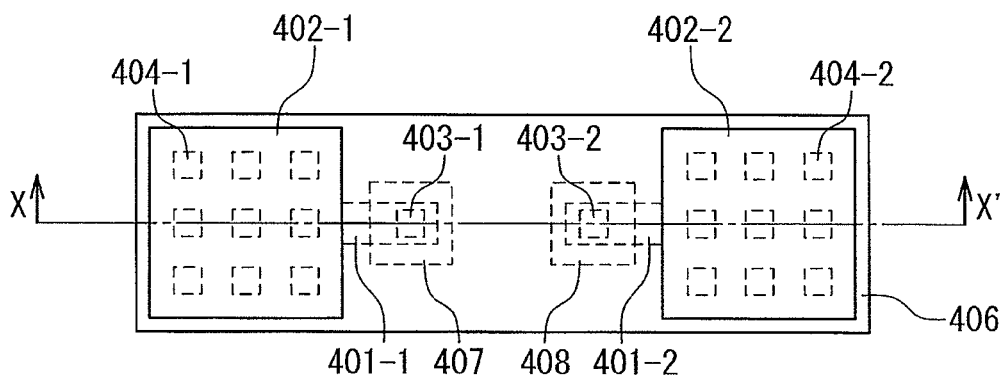
FIG. 1A is a plan view of a conventional DUT (Device Under Test) pattern semiconductor device.
Figure 1B:
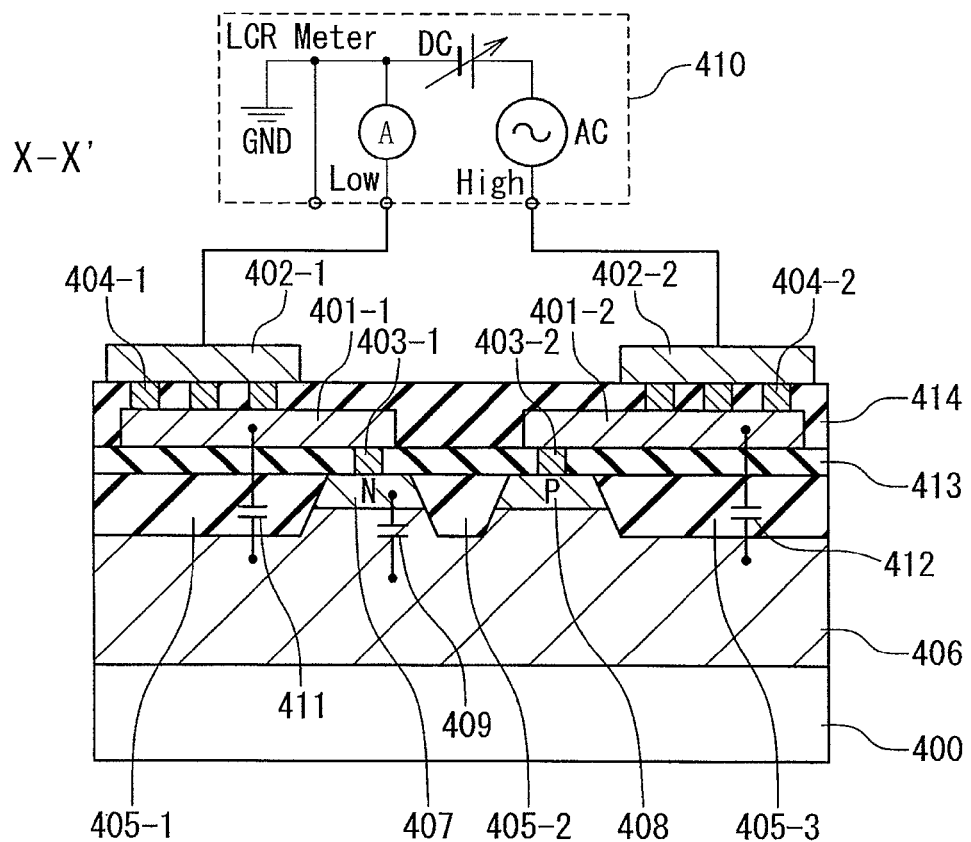
FIG. 1B is a diagram showing a section of the semiconductor device along a line X-X' of FIG. 1A and a semiconductor device measuring system applied to the conventional DUT pattern semiconductor device.
Figure 2A:
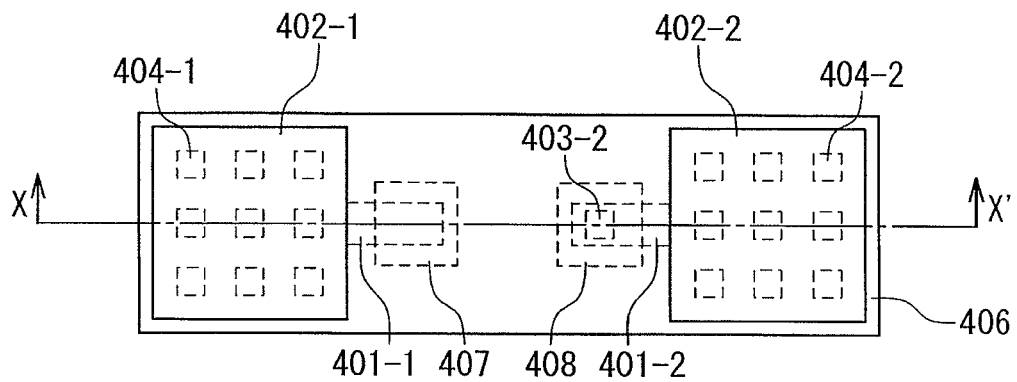
FIG. 2A is a plan view of a conventional calibration pattern semiconductor device.
Figure 2B:
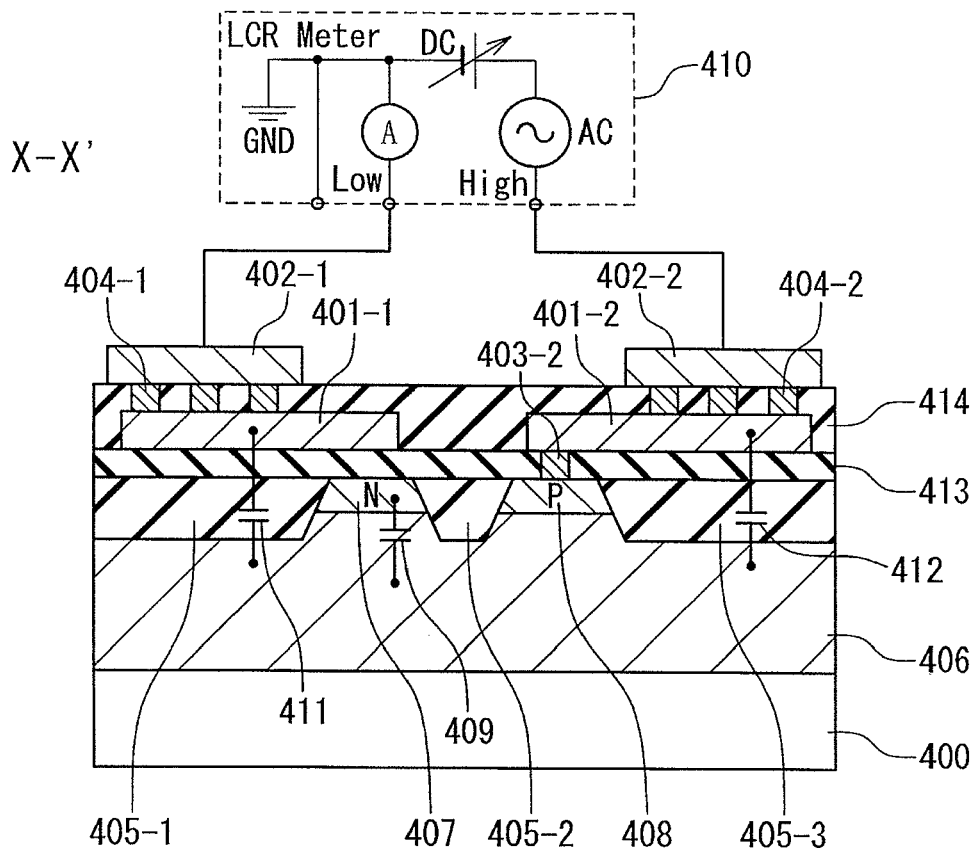
FIG. 2B is a diagram showing a section of the semiconductor device along a line X-X' of FIG. 2A and the semiconductor device measuring system.
Figure 3A:
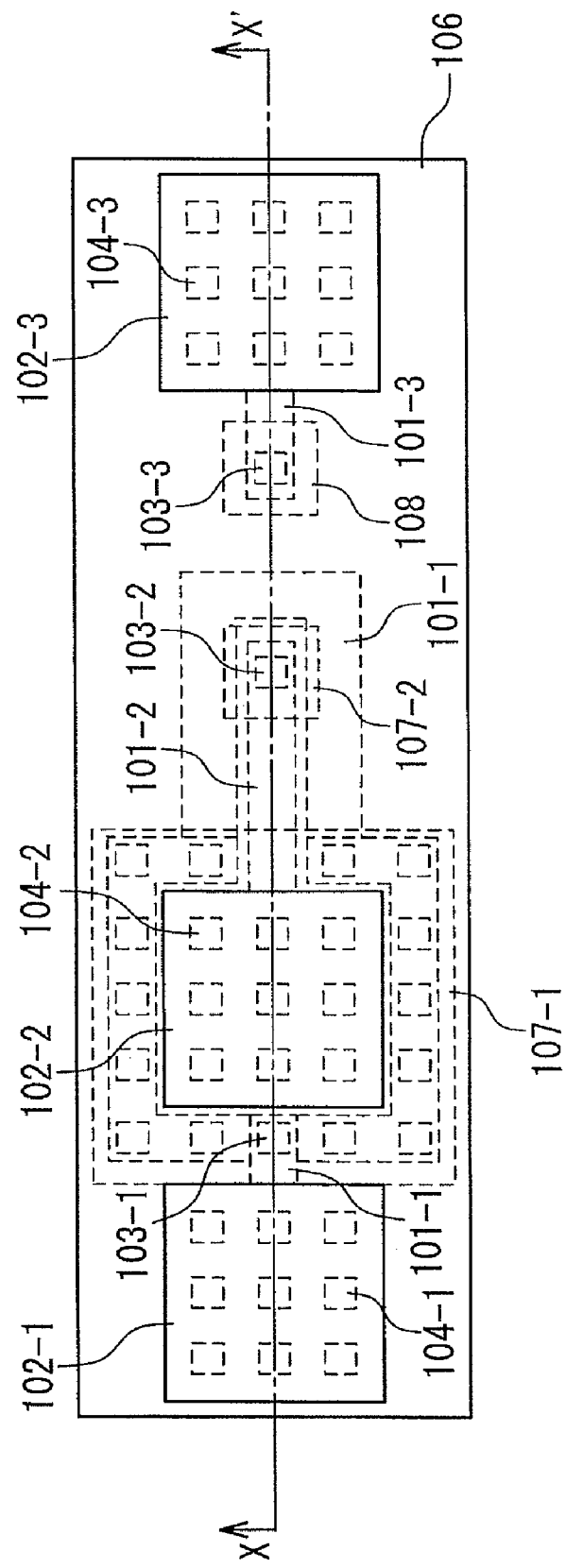
FIG. 3A is a plan view of a semiconductor device according to a first embodiment of the present invention.
Figure 3B:
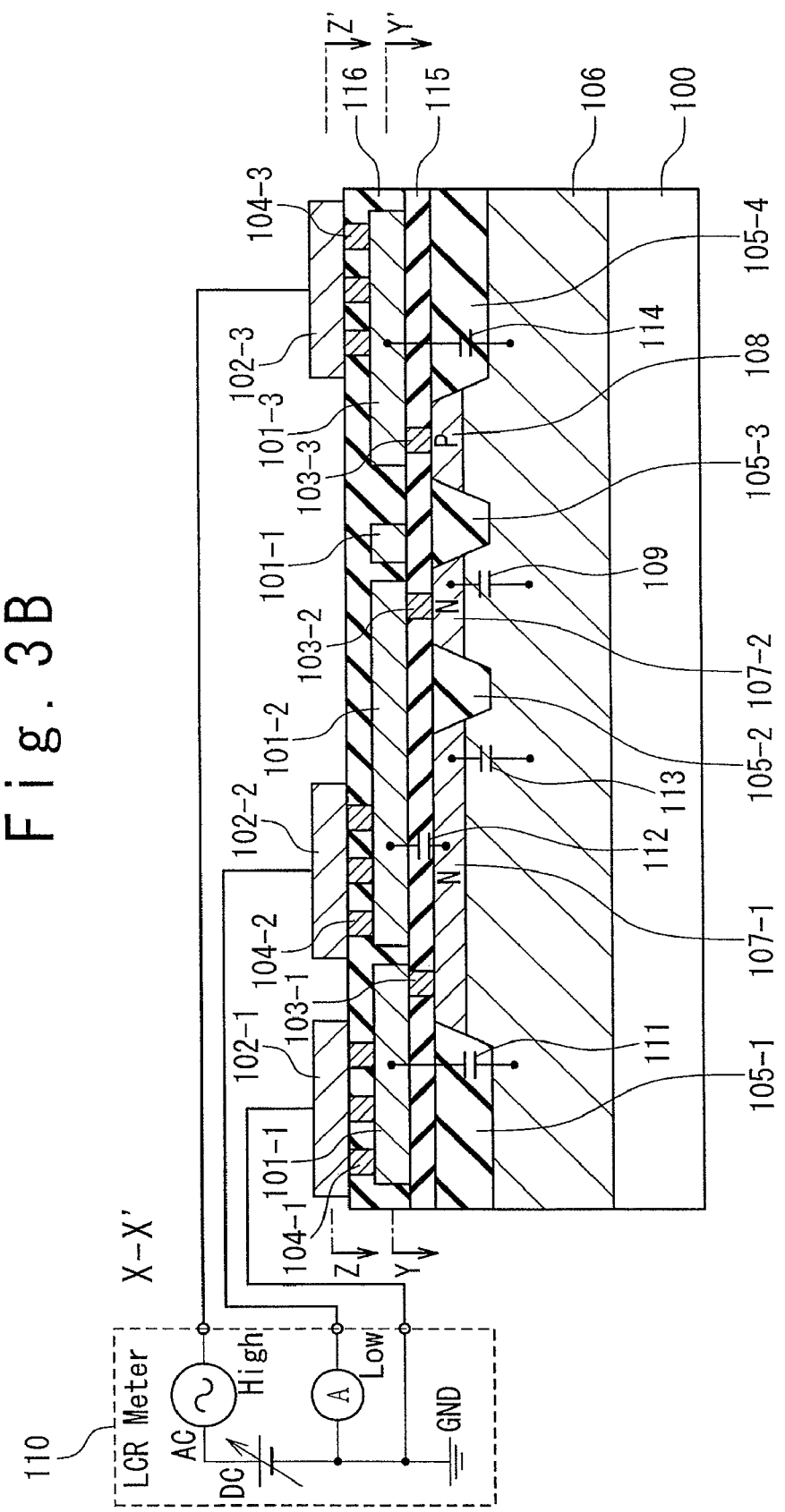
FIG. 3B is a diagram showing a section of the semiconductor device in the first embodiment along a line X-X' of FIG. 3A and a semiconductor device measuring system applied to the semiconductor device according to the first embodiment of the present invention.

FIG. 3A is a plan view of a semiconductor device according to a first embodiment of the present invention. FIG. 3B is a diagram showing the section of the semiconductor device in the first embodiment along a line X-X' of FIG. 3A and a semiconductor device measuring system applied to the semiconductor device.

The semiconductor device according to the first embodiment includes a semiconductor substrate 100 of a first conductive type; a well 106 of a second conductive type; first to fourth insulating films 105-1 to 105-4; first and second diffusion layers 107-1 and 107-2 of the first conductive type; a diffusion layer 108 of the second conductive type; a fifth insulating film 115; first to third via-contacts 103-1 to 103-3; first to third first-layer conductive wiring layers 101-1 to 101-3; a sixth insulating film 116; first to third via-contacts 104-1 to 104-3; and first to third second-layer conductive wiring layers 102-1 to 102-3. Here, the first conductive type and the second conductive type are assumed to be an N-type and a P-type, respectively.

A P-type well 106 is formed on or above an N-type semiconductor substrate 100. The insulating films 105-1 to 105-4 are formed in the surface portion of the P-type well 106. An N-type diffusion layer 107-1 is formed between the insulating films 105-1 and 105-2 in the surface portion of the well 106. An N-type diffusion layer 107-2 is formed between the insulating films 105-2 and 105-3 in the surface portion of the well 106. A P-type diffusion layer 108 is formed between the insulating films 105-3 and 105-4 in the surface portion of the well 106.

The P-type well 106, the insulating films 105-1 to 105-4, the N-type diffusion layers 107-1 and 107-2, and the P-type diffusion layer 108 are covered with the insulating film 115. The via-contact 103-1 is formed on the N-type diffusion layer 107-1 to pass through the insulating film 115. The via-contact 103-2 is formed on the N-type diffusion layer 107-2 to pass through the insulating film 115. The via-contact 103-3 is formed on the P-type diffusion layer 108 to pass through the insulating film 115. The via-contacts 103-1 to 103-3 connect the diffusion layers 107-1, 107-2 and 108 and first-layer conductive wiring layers 101-1 to 101-3 formed on the insulating film 115, respectively.

The first-layer conductive wiring layers 101-1 to 101-3 are covered with the insulating film 116. The via-contacts 104-1 are formed on the first-layer conductive wiring layer 101-1 to pass through the insulating film 116. The via-contacts 104-2 are formed on the first-layer conductive wiring layer 101-2 to pass through the insulating film 116. The via-contacts 104-3 are formed on the first-layer conductive wiring layer 101-3 to pass through the insulating film 116. The via-contacts 104-1 to 104-3 connect the first-layer conductive wiring layers 101-1 to 101-3 and the second-layer conductive wiring layers 102-1 to 102-3 formed on the insulating film 116, respectively.

The conductive wiring layers may be metal wiring layers. Also, a metal layer may be formed on the N-type diffusion layer 107-1.

An LCR meter is usually used for measurement of the semiconductor device. The LCR meter 110 has a power supply and an ammeter. The power supply is connected between a high voltage terminal High for supplying a first voltage, and a ground terminal GND grounded. The ammeter is connected between a low voltage terminal Low for supplying a second voltage lower than the first voltage, and the ground terminal GND. In the LCR meter 110, a voltage, in which a small AC voltage is superimposed on a DC bias voltage, is applied from the power supply to a target semiconductor device between the high voltage terminal High and the low voltage terminal Low, and an AC current (absolute value and phase) is measured by the ammeter. Thus, a capacitance of the target semiconductor device (PN junction capacitance in this example) is calculated. Also, a coaxial cable is usually used for wiring from the LCR meter 110 to the target semiconductor device. To block noise from the outside, the shield side of the coaxial cable is connected to the ground terminal GND.

In order to measure the PN junction capacitance 109 between the N-type diffusion layer 107-2 and the P-type well 106 by this LCR meter 110, the ground terminal GND, the low voltage terminal Low, and the high voltage terminal High of the LCR meter 110 are respectively connected to the second-layer conductive wiring layers 102-1 to 102-3.

However, in the structure of the semiconductor device according to the first embodiment of the present invention, there are the following four kinds of parasitic capacitances to be removed from the calculation of the PN junction capacitance: a parasitic capacitance 111 formed between the first-layer conductive wiring layer 101-1 and the P-type well 106; a parasitic capacitance 112 formed between the first-layer conductive wiring layer 101-2 and the N-type diffusion layer 107-1 beneath the layer 101-2; a parasitic capacitance 113 formed between the N-type diffusion layer 107-1 and the P-type well 106; and a parasitic capacitance 114 caused between the first-layer conductive wiring layer 101-3 and the P-type well 106.

Next, an operation of a semiconductor device measuring system will be described.

The voltage in which the small AC voltage is superimposed on the DC bias voltage is applied to the second-layer conductive wiring layers 102-3 from the high voltage terminal High of the LCR meter 110. At this time, a charging/discharging current due to the PN junction 109 flows through two paths: a first path is from the high voltage terminal High to the second-layer conductive wiring layer 102-3, the via-contacts 104-3, the first-layer conductive wiring layer 101-3, the via-contact 103-3, the P-type diffusion layer 108, and the P-type well 106, and a second path is from the P-type well 106 to the PN junction capacitance 109, the N-type diffusion layer 107-2, the via-contact 103-2, the first-layer conductive wiring layer 101-2, the via-contacts 104-2, the second-layer metal layer 102-2, and the low voltage terminal Low.

At the same time, a charging/discharging current due to the parasitic capacitance 113 flows through the first path from the high voltage terminal High to the second-layer conductive wiring layer 102-3, the via-contacts 104-3, the first-layer conductive wiring layer 101-3, the via-contact 103-3, the P-type diffusion layer 108, and the P-type well 106, and a third path from the P-type well 106 to the parasitic capacitance 113, the N-type diffusion layer 107-1, the via-contact 103-1, the first-layer conductive wiring layer 101-1, the via-contacts 104-1, the second-layer conductive wiring layer 102-1, and the ground terminal GND.

Further, also a charging/discharging current due to the parasitic capacitance 111 flows through the first path from the high voltage terminal High to the second-layer conductive wiring layer 102-3, the via-contacts 104-3, the first-layer conductive wiring layer 101-3, the via-contact 103-3, the P-type diffusion layer 108, and the P-type well 106, and a fourth path from the P-type well to the parasitic capacitance 111, the first-layer conductive wiring layer 101-1, the via-contacts 104-1, the second-layer conductive wiring layer 102-1, and the ground terminal GND. Thus, the fourth path is a part of the third path.

Here, the charging/discharging currents by the parasitic capacitance 111 and the parasitic capacitance 113 do not flow through the low voltage terminal Low of the LCR meter 110 but flow to the ground terminal GND. Thus, the values of the parasitic capacitance 111 and the parasitic capacitance 113 are not included in the measured value of the LCR meter 110.

Also, regarding a charging/discharging current due to the parasitic capacitance 112, the low voltage terminal Low of the LCR meter 110 is grounded together with the ground terminal GND, so that the second-layer conductive wiring layers 102-1 and 102-2 have the same voltage, and therefore both ends of the parasitic capacitance 112 are the same voltage. Thus, the charging/discharging current due to the parasitic capacitance 112 does not flow.

Also, regarding a charging/discharging current due to the parasitic capacitance 114, both ends of the parasitic capacitance 114 are electrically shorted by the second-layer conductive wiring layer 102-3, the via-contacts 104-3, the first-layer conductive wiring layer 101-3, the via-contact 103-3, the P-type diffusion layer 108, and the P-type well 106. Thus, the charging/discharging current due to the parasitic capacitance 114 does not flow.

In this case, only the value of the PN junction capacitance 109 is measured as a measured value of the LCR meter 110.

As described above, according to the semiconductor device according to the first embodiment of the present invention, the diffusion layer of the first conductive type 107-1 is grounded. Therefore, it is possible to measure the semiconductor capacitance other than the parasitic capacitances 111 to 114, in other words, to correctly measure the semiconductor capacitance.

Further, according to the semiconductor device according to the first embodiment of the present invention, a calibration pattern for cancelling the parasitic capacitances 111 to 114 (or a calibration pattern semiconductor device) is not required and thus it is possible to reduce a chip area of the measurement pattern and to shorten the measurement time, as compared with the conventional semiconductor device measuring system.

FIG. 3C is a plan view of a plane Y-Y' plane in FIG. 3B, and FIG. 3D is a plan view of a plane Z-Z' in FIG. 3B. The first-layer conductive wiring layer 101-1 includes a first planar shape corresponding wiring portion 101-1a and a first support wiring portion 101-1b. The planar shape of the planar shape corresponding wiring portion 101-1a corresponds to the planer shape of the second-layer conductive wiring layer 102-1. In a plane, the support wiring portion 101-1b extends in parallel to the N-type semiconductor substrate 100 and has its one end connected to the via-contact 103-1 and the other end connected to the planar shape corresponding wiring portion 101-1a.

The first-layer conductive wiring layer 101-2 includes a second planar shape corresponding wiring portion 101-2a and a second support wiring portion 101-2b. The planar shape of the planar shape corresponding wiring portion 101-2a corresponds to the planer shape of the second-layer conductive wiring layer 102-2. In the plane, the support wiring portion 101-2b extends in parallel to the N-type semiconductor substrate 100 and has its one end connected to the via-contact 103-2 and the other end connected to the planar shape corresponding wiring portion 101-2a.

The first-layer conductive wiring layer 101-1 further includes first and second first-layer surrounding wiring portions 101-1c and 101-1d. In the plane, the first-layer surrounding wiring portions 101-1c is connected to the support wiring portion 101-1b to surround the planar shape corresponding wiring portion 101-2a. The first-layer surrounding wiring portions 101-1d is connected to the first-layer surrounding wiring portion 101-1c to surround the support wiring portion 101-2b.

The first-layer conductive wiring layer 101-3 includes a third planar shape corresponding wiring portion 101-3a and a third support wiring portion 101-3b. The planar shape of the planar shape corresponding wiring portion 101-3a corresponds to the planar shape of the second-layer conductive wiring layer 102-3. In the plane, the support wiring portion 101-3b extends parallel to the N-type semiconductor substrate 100 and has its one end connected to the via-contact 103-3 and the other end connected to the planar shape corresponding wiring portion 101-3a.

As described above, according to the semiconductor device according to the first embodiment of the present invention, the first-layer conductive wiring layer 101-2 is surrounded in the plane by the first-layer conductive wiring layer 101-1. With this, the first-layer conductive wiring layer 101-1 is shielded by the first-layer conductive wiring layer 101-2 in such a manner that the first-layer conductive wiring layer 101-1 does not receive influence of noise from the outside.

Further, according to the semiconductor device according to the first embodiment of the present invention, the N-type diffusion layer 107-1 is formed directly below the planar shape corresponding wiring portion 101-2a and the first-layer surrounding wiring layer 101-1c through the insulating film 116. With this, a portion below the first-layer conductive wiring layers 101-1 and 101-2 is shielded by the N-type diffusion layer 107-1, in such a manner that the first-layer conductive wiring layers 101-1 and 101-2 do not receive influence of noise from the outside.

In the semiconductor device according to the first embodiment of the present invention, the first conductive type and the second conductive type are not limited to the N-type and the P-type, but may be the P-type and the N-type. In this case, in the semiconductor device according to the first embodiment of the present invention, the semiconductor capacitance can be measured in the same manner as described above. However, the polarity of the DC bias voltage in the LCR meter 110 needs to be reversed.

Further, in the semiconductor device according to the first embodiment of the present invention, the semiconductor capacitance is not limited to the PN junction capacitance 109, but may be an oxide film capacitance and a wiring-to-wiring capacitance. Even in such a case, the semiconductor capacitance other than the parasitic capacitances can be measured. Moreover, when there are a plurality of capacitance patterns, the shield terminal corresponding to the second-layer conductive wiring layer 102-1 can be commonly used.

Second Embodiment

Figure 4A:
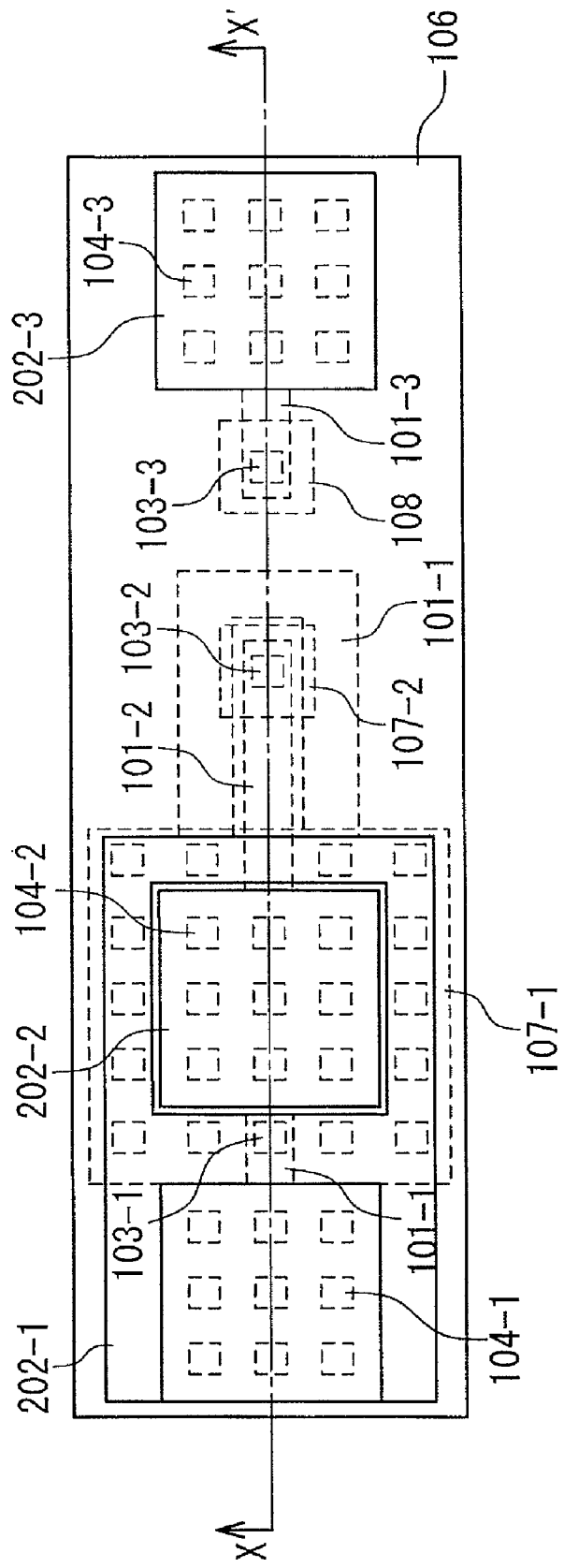
FIG. 4A is a plan view of a semiconductor device according to a second embodiment of the present invention.

FIG. 4A is a plan view of the semiconductor device according to a second embodiment of the present invention. FIG. 4B is a diagram showing the section of the semiconductor device along a line X-X' of FIG. 4A and a semiconductor device measuring system applied to the semiconductor device according to the second embodiment of the present invention.

In the semiconductor device according to the second embodiment of the present invention, second-layer conductive wiring layers 202-1 and 202-2 are formed in place of the second-layer conductive wiring layers 102-1 and 102-2. In the description of the second embodiment, same descriptions as those of the first embodiment will be omitted.

FIG. 4C is a plan view of the semiconductor device along a plane Y-Y' of FIG. 4B and FIG. 4D is a plan view of the semiconductor device along a plane Z-Z' of FIG. 4B. The second-layer conductive wiring layers 202-1 includes a second-layer planar shape corresponding wiring portion 202-1*a* and first and second second-layer surrounding wiring portions 202-1*b* and 202-1*c*. In the plane, the second-layer planar shape corresponding wiring portion 202-1*a* corresponds to the planar shape of the planar shape corresponding wiring portion 101-1*a* and has the same planar shape as that of the second-layer conductive wiring layer 202-2. The second-layer surrounding wiring portion 202-1*b* surrounds the second-layer planar shape corresponding wiring portion 202-1*a*. The second-layer surrounding wiring portion 202-1*c* is connected to the second-layer surrounding wiring portion 202-1*b* and surrounds the second-layer conductive wiring layer 202-2.

As described above, according to the semiconductor device according to the second embodiment of the present invention, the second-layer conductive wiring layer 202-2 is surrounded in the plane by the second-layer conductive wiring layer 202-1. With this, the second-layer conductive wiring layer 202-1 is shielded by the second-layer conductive wiring layer 202-2, in such a manner that the second-layer conductive wiring layer 202-1 can reduce the influence of noise from the outside more than in the first embodiment.

Third Embodiment

In the first embodiment, a portion below the first-layer conductive wiring layers 101-1 and 101-2 is shielded by the diffusion layer 107-1 of the first conductive type, but in a third embodiment, a portion below a conductive wiring layer is shielded by another conductive wiring layer.

Figure 5A:
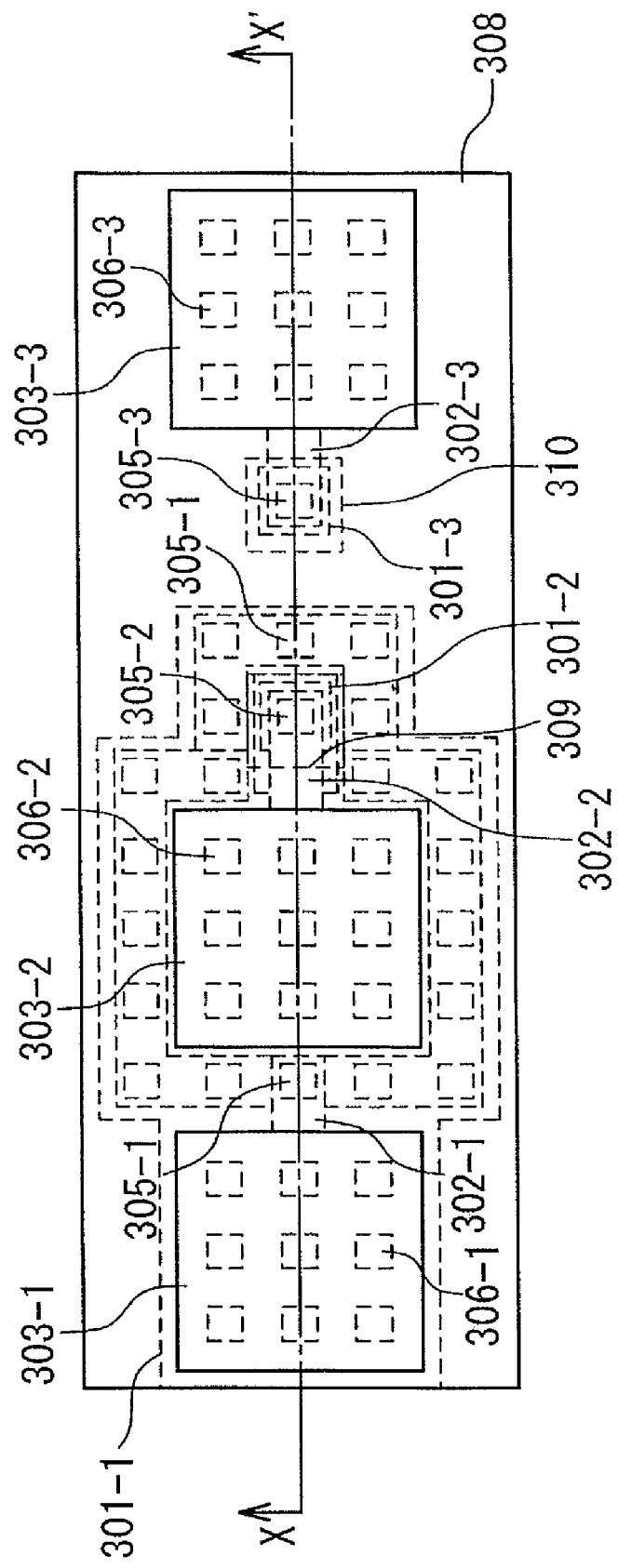
FIG. 5A is a plan view of a semiconductor device according to a third embodiment of the present invention.

FIG. 5A is a plan view of a semiconductor device according to a third embodiment of the present invention. FIG. 5B is a diagram showing a section of the semiconductor device along a line X-X' of FIG. 5A and a semiconductor device measuring system applied to the semiconductor device.

The semiconductor device according to the third embodiment of the present invention includes: a semiconductor substrate 300 of the first conductive type; a well 308 of the second conductive type; first to third insulating films 307-1 to 307-3; a diffusion layer 309 of the first conductive type; a diffusion layer 310 of the second conductive type; a fourth insulating film 316; first and second first-layer via-contacts 304-1 and 304-2; first to third first-layer conductive wiring layers 301-1 to 301-3; a fifth insulating layer 317; first to third second-layer via-contacts 305-1 to 305-3; first to third second-layer conductive wiring layers 302-1 to 302-3; a sixth insulating film 318; first to third via-contacts 306-1 to 306-3; and first to third third-layer conductive wiring layers 303-1 to 303-3. Here, the first conductive type and the second conductive type are assumed to be the N-type and the P-type, respectively.

The P-type well 308 is formed on the N-type semiconductor substrate 300. The insulating films 307-1 to 307-3 are formed in the surface portion of the P-type well 308. The N-type diffusion layer 309 is formed between the insulating film 307-1 and the insulating film 307-2 in the surface portion of the P-type well 308. The diffusion layer 310 of the P-type is formed between the insulating film 307-2 and the insulating film 307-3 in the surface portion of the P-type well 308.

The P-type well 308, the insulating films 307-1 to 307-3, the N-type diffusion layer 309, and the P-type diffusion layer 310 are covered with the insulating film 316. The first-layer via-contact 304-1 is formed on the N-type diffusion layer 309 to pass through the insulating film 316. The first-layer via-contact 304-2 is formed on the P-type diffusion layer 310 to pass through the insulating film 316. The first-layer conductive wiring layers 301-1, 301-2, and 301-3 are formed on the insulating layer 316 and the first-layer via-contacts 304-1 and 304-2.

The first-layer conductive wiring layers 301-1 to 301-3 are covered with the insulating film 317. The second-layer via-contact 305-1 is formed on the first-layer conductive wiring layer 301-1 to pass through the insulating film 317. The second-layer via-contact 305-2 is formed on the first-layer conductive wiring layer 301-2 to pass through the insulating film 317. The second-layer via-contact 305-3 is formed on the first-layer conductive wiring layer 301-3 to pass through the insulating film 317. The second-layer conductive wiring layers 302-1 to 302-3 are formed on the second-layer via-contacts 305-1 to 305-3, respectively.

The second-layer conductive wiring layers 302-1 to 302-3 are covered with the insulating film 318. The via-contacts 306-1 are formed on the second-layer conductive wiring layer 302-1 to pass through the insulating film 318. The via-contacts 306-2 are formed on the second-layer conductive wiring layer 302-2 to pass through the insulating film 318. The via-contacts 306-3 formed on the second-layer conductive wiring layer 302-3 to pass through the insulating film 318. The third-layer conductive wiring layers 303-1 to 303-3 are formed on the via-contacts 306-1 to 306-3, respectively.

The conductive wiring layers may be metal wiring layers.

An LCR meter 110 is connected to the semiconductor device according to the third embodiment of the present invention. The LCR meter is usually used for measurement of the semiconductor. The LCR meter 110 has a power supply and an ammeter. The power supply is connected between a high voltage terminal High for supplying a first voltage, and a ground terminal GND grounded. The ammeter is connected between a low voltage terminal Low for supplying a second voltage lower than the first voltage, and the ground terminal GND. In the LCR meter 110, the voltage, in which a small AC voltage is superimposed on a DC bias voltage, is applied between the high voltage terminal High and the low voltage terminal Low from the power supply to a target semiconductor device, and an AC current (absolute value and phase) is measured by the ammeter. Thus, a capacitance (a PN junction capacitance in this example) of the target semiconductor device is calculated. Further, a coaxial cable is usually used as a wiring from the LCR meter 110 to the target semiconductor device. To shield noise from the outside, the shield side of the coaxial cable is connected to the ground terminal GND.

In order to measure the PN junction capacitance 314 between the N-type diffusion layer 309 and the P-type well 308 by this LCR meter 110, the third-layer conductive wiring layers 303-1 to 303-3 are connected to the ground terminal GND, the low voltage terminal Low, and the high voltage terminal High of the LCR meter 110, respectively. However, parasitic capacitances to be removed from the measurement result in the semiconductor device according to the third embodiment of the present invention are of the following three kinds: a parasitic capacitance 311 formed between the first-layer conductive wiring layer 301-1 and the P-type well 308; a parasitic capacitance 312 formed between the first-layer conductive wiring layer 302-2 and the first-layer conductive wiring layer 301-1 beneath the layer 302-2; and a parasitic capacitance 313 formed between the first-layer conductive wiring layer 302-3 and the P-type well 308.

Next, an operation of the system of measuring the semiconductor device will be described. The voltage obtained by superimposing the small-amplitude AC voltage signal on the DC bias voltage signal is applied to the third-layer conductive wiring layer 303-3 from the high voltage terminal High of the LCR meter 315.

At this time, a charging/discharging current due to the PN junction capacitance 314 flows through a first path from the high voltage terminal High to the third-layer conductive wiring layer 303-3, the via-contacts 306-3, the second-layer conductive wiring layer 302-3, the second-layer via-contact 305-3, the first-layer conductive wiring layer 301-3, the first-layer via-contact 304-3, the P-type diffusion layer 310, and the P-type well 308, and through a second path from the P-type well 308, to the PN junction capacitance 314, the N-type diffusion layer 309, the first-layer via-contact 304-1, the first-layer conductive wiring layer 301-2, the second-layer via-contact 305-2, the second-layer conductive wiring layer 302-2, the via-contacts 306-2, the third-layer conductive wiring layer 303-2, and the low voltage terminal Low in this order.

At the same time, a charging/discharging current due to the parasitic capacitance 311 flows through the first path from the high voltage terminal High to the third-layer conductive wiring layer 303-3, the via-contacts 306-3, the second-layer conductive wiring layer 302-3, the second-layer via-contact 305-3, the first-layer conductive wiring layer 301-3, the first-layer via-contact 304-3, the P-type diffusion layer 310, and the P-type well 308, and a third path from the P-type well 308 to the parasitic capacitance 311, the first-layer conductive wiring layer 301-1, the second-layer via-contact 305-1, the second-layer conductive wiring layer 302-1, the via-contacts 306-1, the third-layer conductive wiring layer 303-1, and the ground terminal GND in this order.

Here, since the charging/discharging currents due to the parasitic capacitance 311 does not flow through the low voltage terminal Low of the LCR meter 110 but flows to the ground terminal GND, the value of the parasitic capacitance 311 is not included in the measured value of the LCR meter 315.

Also, regarding the charging/discharging current due to the parasitic capacitance 312, the low voltage terminal Low of the LCR meter 110 is grounded together with the ground terminal GND. Therefore, the third-layer conductive wiring layers 303-1 and 303-2 are set to the same voltage. Thus, both ends of the parasitic capacitance 312 are set to the same voltage and accordingly the charging/discharging current by the parasitic capacitance 312 does not flow.

Also, regarding the charging/discharging current due to the parasitic capacitance 313, both end of the parasitic capacitance 313 is electrically short-circuited by the third-layer conductive wiring layer 303-3, the via-contacts 306-3, the second-layer conductive wiring layer 302-3, the second-layer via-contact 305-3, the first-layer conductive wiring layer 301-3, the first-layer via-contact 304-3, the P-type diffusion layer 310, and the P-type well 308. Thus, the charging/discharging current due to the parasitic capacitance 313 does not flow.

In this case, only the value of the PN junction capacitance 314 is measured as the measured value of the LCR meter 315.

As described above, according to the semiconductor device according to the third embodiment of the present invention, the first-layer conductive wiring layer 301-1 is formed and the first-layer conductive wiring layer 301-1 is grounded, so that it is possible to measure the semiconductor capacitance (the PN junction capacitance 314) other than the parasitic capacitances 311 to 313, in other words, to correctly measure the semiconductor capacitance.

Further, according to the semiconductor device according to the third embodiment of the present invention, a measurement pattern for calibration (calibration pattern semiconductor device) for cancelling the parasitic capacitances 311 to 313 is not required and thus it is possible to reduce the chip area of the measurement pattern and to shorten the measurement time as compared with the conventional semiconductor device measuring system.

FIG. 5C is a plan view of the semiconductor device along a plane V-V' of FIG. 5B, and FIG. 5D is a plan view of the semiconductor device along a plane Y-Y' of FIG. 5B, and FIG. 5E is a plan view of the semiconductor device along a plane Z-Z' of FIG. 5B.

The second-layer conductive wiring layer 302-1 includes a first planar shape corresponding wiring portion 302-1a and a first support wiring portion 302-1b. The planar shape of the planar shape corresponding wiring portion 302-1a corresponds to the planer shape of the third-layer conductive wiring layer 303-1. In the plane, the support wiring portion 302-1b extends in parallel to the N-type semiconductor substrate 300 and has its one end connected to the second-layer via-contact 305-1 and the other end connected to the planar shape corresponding wiring portion 302-1a.

The second-layer conductive wiring layer 302-2 includes a second planar shape corresponding wiring portion 302-2a and a second support wiring portion 302-2b. The planar shape of the planar shape corresponding wiring portion 302-2a corresponds to the planer shape of the third-layer conductive wiring layer 303-2. In the plane, the support wiring portion 302-2b extends in parallel to the N-type semiconductor substrate 300 and has its one end connected to the second-layer via-contact 305-2 and the other end connected to the planar shape corresponding wiring portion 302-2a.

The second-layer conductive wiring layer 302-1 further includes first and second second-layer surrounding wiring portions 302-1c and 302-1d. In the plane, the second-layer surrounding wiring portion 302-1c is connected to the support wiring portion 302-1b to surround the planar shape corresponding wiring portion 302-2a. The second-layer surrounding wiring portion 302-1d is connected to the second-layer surrounding wiring portion 302-1c to surround the support wiring portion 302-2b.

The second-layer conductive wiring layer 302-3 includes a third planar shape corresponding wiring portion 302-3a and a third support wiring portion 302-3b. In the plane, the planar shape of the planar shape corresponding wiring portion 302-3a corresponds to the planar shape of the third-layer conductive wiring layer 303-3. The support wiring portion 302-3b extends in parallel to the N-type semiconductor substrate 300 and has its one end connected to the second-layer via-contact 305-3 and the other end connected to the planar shape corresponding wiring portion 302-3a.

The first-layer conductive wiring layer 301-1 includes first and second first-layer planar shape corresponding wiring portions 301-1a and 301-1b and a first-layer surrounding wiring portion 301-1c. In the plane, the planar shape of the first-layer planar shape corresponding wiring portion 301-1a corresponds to the planar shape of the planar shape corresponding wiring portion 302-1a or the planar shape of the third-layer conductive wiring layer 303-3. The first-layer planar shape corresponding wiring portion 301-1b is connected to the first-layer planar shape corresponding wiring portion 301-1a. The first-layer surrounding wiring portion 301-1c is connected to the first-layer planar shape corresponding wiring portion 301-1b to surround the first-layer conductive wiring layer 301-2.

As described above, according to the semiconductor device according to the third embodiment of the present invention, the second-layer conductive wiring layer 302-2 is surrounded in the plane by the second-layer conductive wiring layer 302-1. With this, the second-layer conductive wiring layer 302-1 is shielded by the second-layer conductive wiring layer 302-2, and the second-layer conductive wiring layer 302-1 do not receive the influence of noise from the outside.

Further, according to the semiconductor device according to the third embodiment of the present invention, the first-layer conductive wiring layer 301-1 is formed below the second-layer conductive wiring layers 302-1 and 302-2 via the insulating film 317. With this, the first-layer conductive wiring layer 301-1 shields a portion below the second-layer conductive wiring layers 302-1 and 302-2, and therefore, the second-layer conductive wiring layers 302-1 and 302-2 do not receive the influence of noise from the outside.

In the semiconductor device according to the third embodiment of present invention, the first conductive type and the second conductive type are not limited to the N-type and the P-type but may be the P-type and the N-type. In this case, in the semiconductor device according to the third embodiment of the present invention, the semiconductor capacitance can be measured in the same manner. However, the polarity of the DC bias in the LCR meter 315 needs to be reversed.

Further, in the semiconductor device according to the third embodiment of present invention, the semiconductor capacitance is not limited to the PN junction capacitance 314 but may be an oxide film capacitance and a wiring-to-wiring capacitance. Even in this case, the semiconductor capacitance other than the parasitic capacitances can be measured. Moreover, when there are a plurality of capacitance patterns, the shield terminal corresponding to the third conductive wiring layer 303-1 can be commonly used.

What is claimed is:

1. A semiconductor device comprising:
   a well of a second conductive type formed on or above a semiconductor substrate of a first conductive type;
   a first diffusion layer of the second conductive type formed in a surface portion of said well;
   a second diffusion layer of the first conductive type formed separately from said first diffusion layer in the surface portion of said well;
   first to third first-layer conductive layers formed above said well; and
   first to third second-layer conductive layers formed above said first to third first-layer conductive layers,
   wherein said first second-layer conductive layer, said first first-layer conductive layer, said first diffusion layer and said well are conductively connected as a first conductive path,
   wherein said second second-layer conductive layer, said second first-layer conductive layer, and said second diffusion layer are conductively connected as a second conductive path,
   wherein said third second-layer conductive layer, and said third first-layer conductive layer are conductively connected as a third conductive path, and
   wherein in measurement of a capacitance between said well and said second diffusion layer, said first second-layer conductive layer is configured to be applied with a voltage, in which a small-amplitude AC voltage is superimposed on a DC bias voltage, from a measuring apparatus, said second second-layer conductive layer is configured to be connected to a ground terminal of the measuring apparatus through an ammeter, and said third second-layer conductive layer is configured to be connected to the ground terminal.

2. The semiconductor device according to claim 1, wherein at least a part of said second first-layer conductive layer is formed straightly above said second diffusion layer.

3. The semiconductor device according to claim 1, wherein said third first-layer conductive layer is formed to surround said second first-layer conductive layer planarly.

4. The semiconductor device according to claim 1, further comprising:
   first to third third-layer conductive layers formed above said first to third second-layer conductive layers,
   wherein said first third-layer conductive layer is conductively connected with said first second-layer conductive layer,
   wherein said second third-layer conductive layer is conductively connected with said second second-layer conductive layer, and
   wherein said third third-layer conductive layer is conductively connected with said third second-layer conductive layer.

5. The semiconductor device according to claim 4, wherein said third first-layer conductive layer is formed to surround said second first-layer conductive layer planarly, and
   wherein said third second-layer conductive layer is formed to surround said second second-layer conductive layer planarly.

6. The semiconductor device according to claim 1, further comprising:
   a third diffusion layer of the first conductive type formed separately from said first and second diffusion layers in the surface portion of said well,
   wherein said third second-layer conductive layer is conductively connected with said third diffusion layer through said third first-layer conductive layer.

7. The semiconductor device according to claim 6, wherein said third diffusion layer extends to a portion below said second first-layer conductive layer.

8. The semiconductor device according to claim 6, wherein said third first-layer conductive layer is formed to surround said second first-layer conductive layer planarly.

9. The semiconductor device according to claim 8, wherein said third second-layer conductive layer is formed to surround said second second-layer conductive layer planarly.

10. A measuring method of a semiconductor device, comprising:
providing a semiconductor device which comprises:
a well of a second conductive type formed on or above a semiconductor substrate of a first conductive type,
a first diffusion layer of the second conductive type formed in a surface portion of said well,
a second diffusion layer of the first conductive type formed separately from said first diffusion layer in the surface portion of said well,
first to third first-layer conductive layers formed above said well, and
first to third second-layer conductive layers formed above said first to third first-layer conductive layers,
wherein said first second-layer conductive layer, said first first-layer conductive layer, said first diffusion layer and said well are conductively connected as a first conductive path;
wherein said second second-layer conductive layer, said second first-layer conductive layer, and said second diffusion layer are conductively connected as a second conductive path;
wherein said third second-layer conductive layer, and said third first-layer conductive layer are conductively connected as a third conductive path;
applying said first second-layer conductive layer with a voltage, in which a small-amplitude AC voltage is superimposed on a DC bias voltage, from a power supply of a measuring apparatus;
connecting said third second-layer conductive layer to the ground terminal;
connecting said second second-layer conductive layer to a ground terminal of the measuring apparatus through the ammeter; and
measuring a current flowing through said second second-layer conductive layer by an ammeter of said measuring apparatus.

11. The measuring method according to claim 10, wherein said providing comprises:
a semiconductor device in which at least a part of said second first-layer conductive layer is formed straightly above said second diffusion layer.

12. The measuring method according to claim 10, wherein said providing comprises:
a semiconductor device in which said third first-layer conductive layer is formed to surround said second first-layer conductive layer planarly.

13. The measuring method according to claim 10, wherein said providing comprises:
a semiconductor device in which further comprises:
first to third third-layer conductive layers formed above said first to third second-layer conductive layers,
wherein said first third-layer conductive layer is conductively connected with said first second-layer conductive layer,
wherein said second third-layer conductive layer is conductively connected with said second second-layer conductive layer, and
wherein said third third-layer conductive layer is conductively connected with said third second-layer conductive layer.

14. The measuring method according to claim 13, wherein said providing comprises:
a semiconductor device in which said third first-layer conductive layer is formed to surround said second first-layer conductive layer planarly, and
wherein said third second-layer conductive layer is formed to surround said second second-layer conductive layer planarly.

15. The measuring method according to claim 10, wherein said providing comprises:
a semiconductor device in which further comprising:
a third diffusion layer of the first conductive type formed separately from said first and second diffusion layers in the surface portion of said well,
wherein said third second-layer conductive layer is conductively connected with said third diffusion layer through said third first-layer conductive layer.

16. The measuring method according to claim 15, wherein said providing comprises:
a semiconductor device in which said third diffusion layer extends to a portion below said second first-layer conductive layer.

17. The measuring method according to claim 15, wherein said providing comprises:
a semiconductor device in which said third first-layer conductive layer is formed to surround said second first-layer conductive layer planarly.

18. The measuring method according to claim 17, wherein said providing comprises:
a semiconductor device in which said third second-layer conductive layer is formed to surround said second second-layer conductive layer planarly.

* * * * *